(12) United States Patent
Yu et al.

(10) Patent No.: US 7,180,746 B2
(45) Date of Patent: Feb. 20, 2007

(54) RETAINING DEVICE FOR HEAT SINK

(75) Inventors: Fang-Xiang Yu, Shenzhen (CN); Meng-Tzu Lee, Tu-Cheng (TW); Shu-Ho Lin, Tu-Cheng (TW); Ming-Kun Cao, Shenzhen (CN)

(73) Assignees: Fu Zhun Precision Industry (Shenzhen) Co., Ltd. (CN); Hon Hai Precision Industry Co., Ltd. (TW)

( * ) Notice: Subject to any disclaimer, the term of this patent is extended or adjusted under 35 U.S.C. 154(b) by 273 days.

(21) Appl. No.: 11/015,056

(22) Filed: Dec. 17, 2004

(65) Prior Publication Data

US 2006/0133038 A1 Jun. 22, 2006

(51) Int. Cl.
*H05K 7/20* (2006.01)

(52) U.S. Cl. ............ 361/719; 361/695; 361/704; 24/458; 257/719

(58) Field of Classification Search ............ None
See application file for complete search history.

(56) References Cited

U.S. PATENT DOCUMENTS

| | | | | |
|---|---|---|---|---|
| 5,448,449 A | | 9/1995 | Bright et al. | |
| 6,574,109 B1 * | | 6/2003 | McHugh et al. | 361/719 |
| 6,648,664 B1 * | | 11/2003 | McHugh et al. | 439/331 |
| 6,728,107 B2 * | | 4/2004 | Tseng et al. | 361/719 |
| 6,731,504 B1 | | 5/2004 | Liu et al. | |
| 6,735,085 B2 * | | 5/2004 | McHugh et al. | 361/719 |
| 6,813,155 B2 * | | 11/2004 | Lo | 361/709 |
| 6,924,984 B2 * | | 8/2005 | Lee et al. | 361/704 |
| 7,063,136 B2 * | | 6/2006 | Yu et al. | 165/185 |
| 2005/0066487 A1 * | | 3/2005 | Zhang | 24/457 |

* cited by examiner

*Primary Examiner*—Boris Chervinsky
(74) *Attorney, Agent, or Firm*—Morris Manning & Martin; Tim Tingkang Xia, Esq.

(57) ABSTRACT

A retaining device (20) for mounting a heat sink (30) to an electronic device (40) includes an unitary metal wire clip (22), a locking device (26) and a camming member (24). The clip includes a pair of spaced apart pressing beams (221), at least one latching beam (223) and a crossbeam (225). The latching beam is set at one side of the pressing beams. The crossbeam extends between the pressing beams at an opposite side thereof. The camming member is pivotably attached to the locking device and includes a cam (242) being engageable with the crossbeam. The camming member is pivotable relative to the locking device from an unlocked position to a locked position and the pressing beams force the heat sink into close contact with the electronic device when the camming member is located at the locked position.

20 Claims, 7 Drawing Sheets

RETAINING DEVICE FOR HEAT SINK

TECHNICAL FIELD

The present invention relates generally to a reining device for heat sink, and more particularly to a retaining device which can conveniently mount a heat sink to an electronic device.

BACKGROUND

It is widely acknowledged that heat is produced during operations of electronic devices such as clipsets or processors of computers. The faster the operation speed is, the larger the amount of heat produced by the electronic device is. However, excessive heat accumulated at the electronic device is likely to affect operations of the electronic device and even results in computer crashes. Therefore, a heat dissipation device such as a heat sink is needed for heat dissipation of the electronic device.

In order to keep the heat sink into close contact with the electronic device, retaining devices such as retainers or fasteners are generally required. FIGS. 7–8 illustrate a prior art heat sink retainer 20 used for attaching a heat sink 40 to a central processing unit (CPU) 50 mounted on a socket 60. The socket 60 has a pair of catches 601 formed at opposite sides thereof, for engaging with the retainer 20. The retainer 20 includes a main body 210 and a bolt 220. The body 210 has a central pressing portion 211 for pressing the heat sink 40 onto the CPU 50. First and second latching arms 212, 213 respectively depend from two free ends of the central pressing portion 211. Each latching arm 212, 213 defines an opening 214, 215 for receiving a corresponding catch 601 of the socket 60. A V-shaped spring portion 216 extends outwardly from a central section of the second latching arm 213, for adjusting the height of the second latching arm 213. In assembly, the openings 214, 215 of the latching arms 212, 213 loosely receive the corresponding catches 601 of the socket 60, and then the blot 220 is screwed into a hole 217 defined at the spring portion 216 to adjust the height of the second latching arm 213. As a result, the openings 214, 215 of the latching arms 212, 213 securely receive the catches 601 of the socket 60 and the central pressing portion 211 exerts a downward force on the heat sink 40 to thereby maintain the heat sink 40 into close contact with the CPU 50. However, this kind of retainer needs a special tool during mounting or dismounting of the heat sink, which is not appreciated by users or operators.

SUMMARY OF THE INVENTION

Accordingly, an object of the present invention is to provide a heat sink retaining device which can conveniently mount a heat sink to an electronic device without using of any tools.

In order to achieve the object set out above, a retaining device for heat sink in accordance with a preferred embodiment of the present invention is used to an electronic device mounted on a printed circuit board. The retaining device comprises an unitary metal wire clip, a locking device and a camming member. The clip includes a pair of spaced apart pressing beams, at least one latching beam and a crossbeam. The latching beam is set at one side of the pressing beams. The crossbeam extends between the pressing beams at an opposite side thereof. The camming member is pivotably attached to the locking device and includes a cam being engageable with the crossbeam. The camming member is capable of moving relative to the locking device between an unlocked position and a locked position. The pressing beams force the heat sink into close contact with the electronic device when the camming member is located at the locked position.

Other objects, advantages and novel features of the present invention will become more apparent from the following detailed description when taken in conjunction with the accompanying drawings, in which:

DETAILED DESCRIPTION OF PREFERRED EMBODIMENTS

Figure 1:
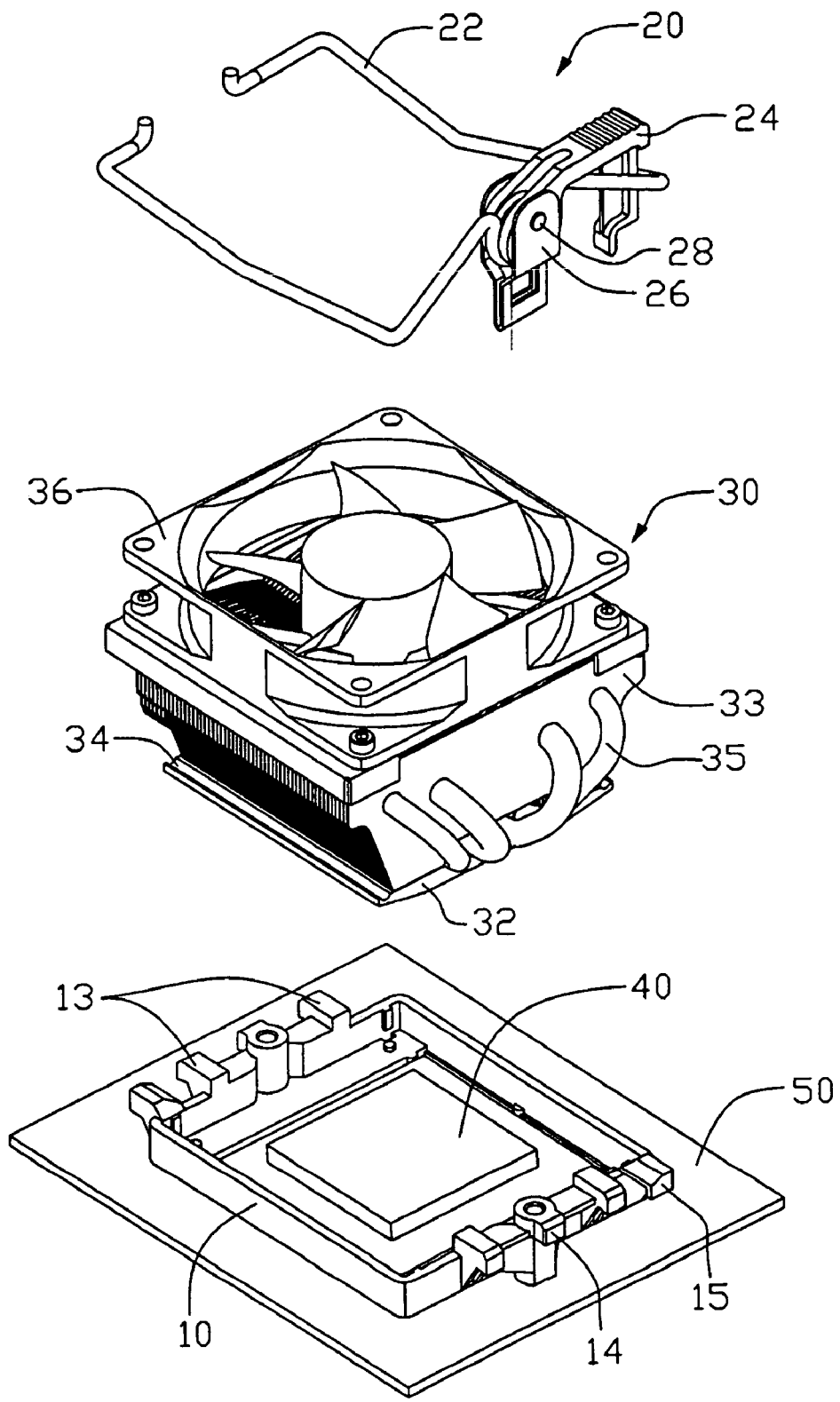
FIG. 1 is an isometric view of a retaining device according to a preferred embodiment of the present invention for securing a heat sink to a CPU mounted on a circuit board and surrounded by a retention module.

Reference will now be made to the drawing figures to describe the present invention in detail.

FIG. 1 illustrates a heat sink retaining device 20 according to a preferred embodiment of the present invention, together with a heat sink 30, an electronic device such as a central processing unit (CPU) 40 mounted on a printed circuit board 50 and a retention module 10 mounted on the printed circuit board 50 surrounding the CPU 40. The retaining device 20 functions to mount the heat sink 30 to the CPU 40 for heat dissipation.

The retention module 10 has a configuration of rectangular in shape and a plurality of catches 13, 14, 15 formed at opposite sides thereof. The heat sink 30 includes a base 32, a plurality of spaced cooling fins 33 extending upwardly from the base 32 and a cooling fan 36 mounted on a top of the fins 33. A plurality of U-shaped heat pipes 35 connects the base 32 with an upper portion of the fins 33. The base 32 defines at opposite sides thereof a pair of parallel grooves 34 with the fins 33 located there between.

Figure 2:
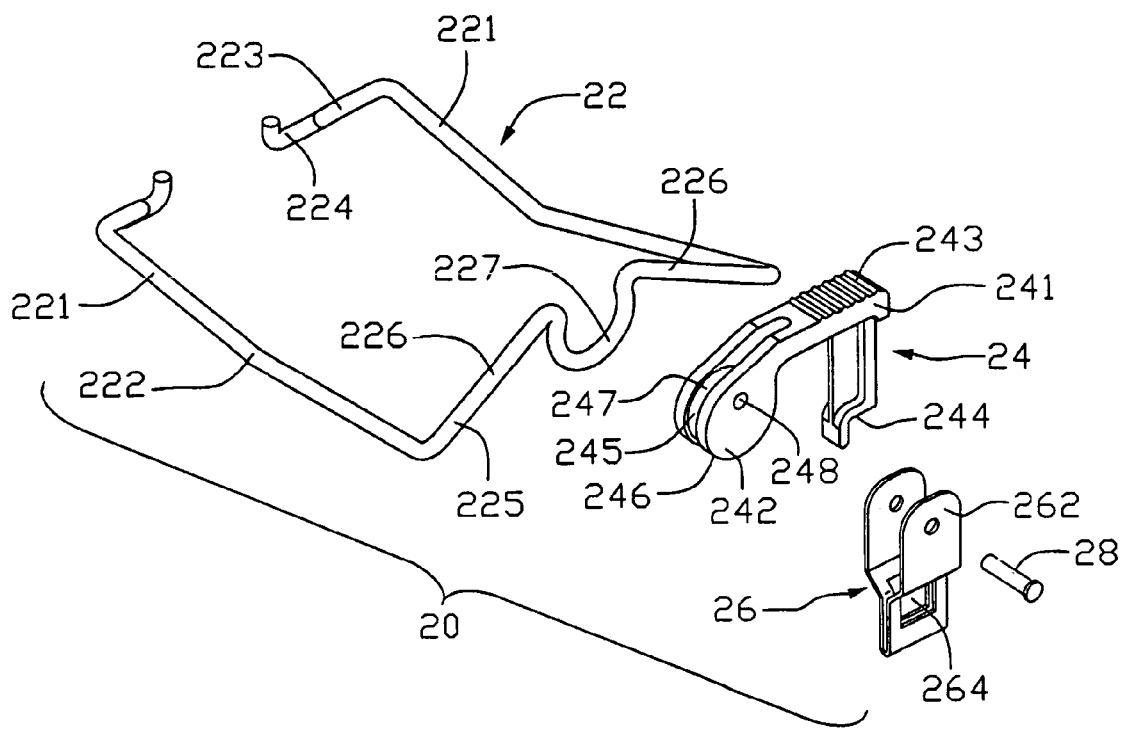
FIG. 2 is an exploded, isometric view of the retaining device of FIG. 1.

Referring to FIG. 2, the retaining device 20 includes a clip 22, a locking device 26, a camming member 24 being engageable with the clip 22 as an urging member and a pivot 28 for connecting the camming member 24 with the locking device 26. The clip 22 is integrally made from an unitary metal wire and includes a pair of spaced apart pressing beams 221, two latching beams 223 extending from one side of the pressing beams 221 and a crossbeam 225 extending between the pressing beams 221 at an opposite side thereof. Each latching beam 223 extends from a first end of a corresponding pressing beam 221 and terminates at a locking portion 224 corresponding to the first catch 13 of the retention module 10. Each pressing beam 221 is bent to form a V-shaped pressing portion 222 at a middle section thereof for providing sufficient resiliency. The crossbeam 225 includes a semicircular engagement portion 227 formed at a middle section thereof and two inclined extension arms 226 each extending between a second end of a corresponding pressing beam 221 and the engagement portion 227.

The locking device 26 is integrally made from a metal plate and includes two spaced tabs 262 faced each other. A retaining hole 264 is defined in the lower portions of the tabs 262 for retaining the second catch 14 of the retention module 10. A pair of aligned pivot holes (not labeled) is defined in the upper portions of the tabs 262 for extension of the pivot 28 therethrough.

The camming member 24 includes a cam 242, a hooked portion 244 and an operation handle 241 extending between the cam 242 and the hooked portion 244. A pivot hole 248 is axially defined through the cam 242, corresponding to the pivot holes of the tabs 262. A groove 245 is circumferentially defined around a periphery of the cam 242, for engagingly receiving the engagement portion 227 of the clip 22. The cam 242 has an abutting portion 246 and a releasing portion 247 at the groove 245. The distance between the pivot hole 248 and the abutting portion 246 is greater than the distance between the pivot hole 248 and the releasing portion 247. The operation handle 241 provides anti-skid ribs 243 at the top surface thereof for facilitating operations. The hooked portion 244 extends downwardly from the operation handle 241 below the anti-skids 243. In assembly, the camming member 24 is attched to the clip 22 via the engagement portion 227 received in the groove 245. The cam 242 is sandwiched between the upper portions of the tabs 262 and the pivot 28 passes through the pivot holes of the tabs 262 and the cam 242 to thereby combine them together (see FIG. 1).

Figure 3:
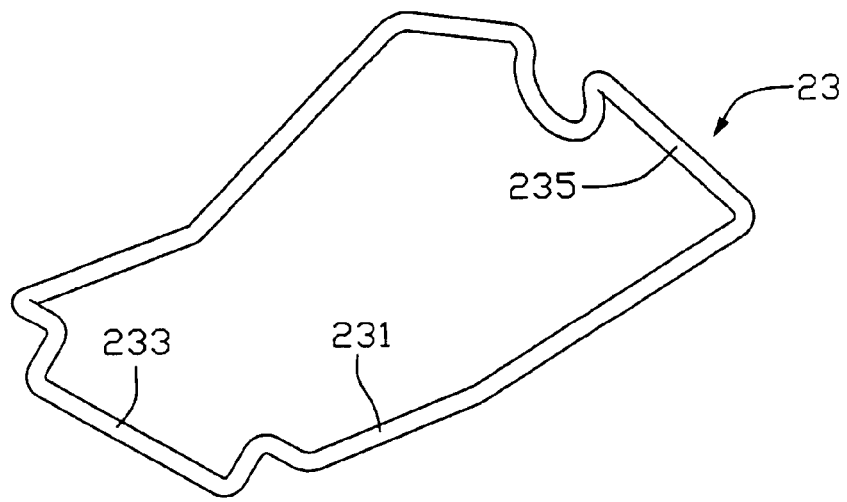
FIG. 3 is an alternative embodiment of the clip of the retaining device of FIG. 2.
Figure 4:
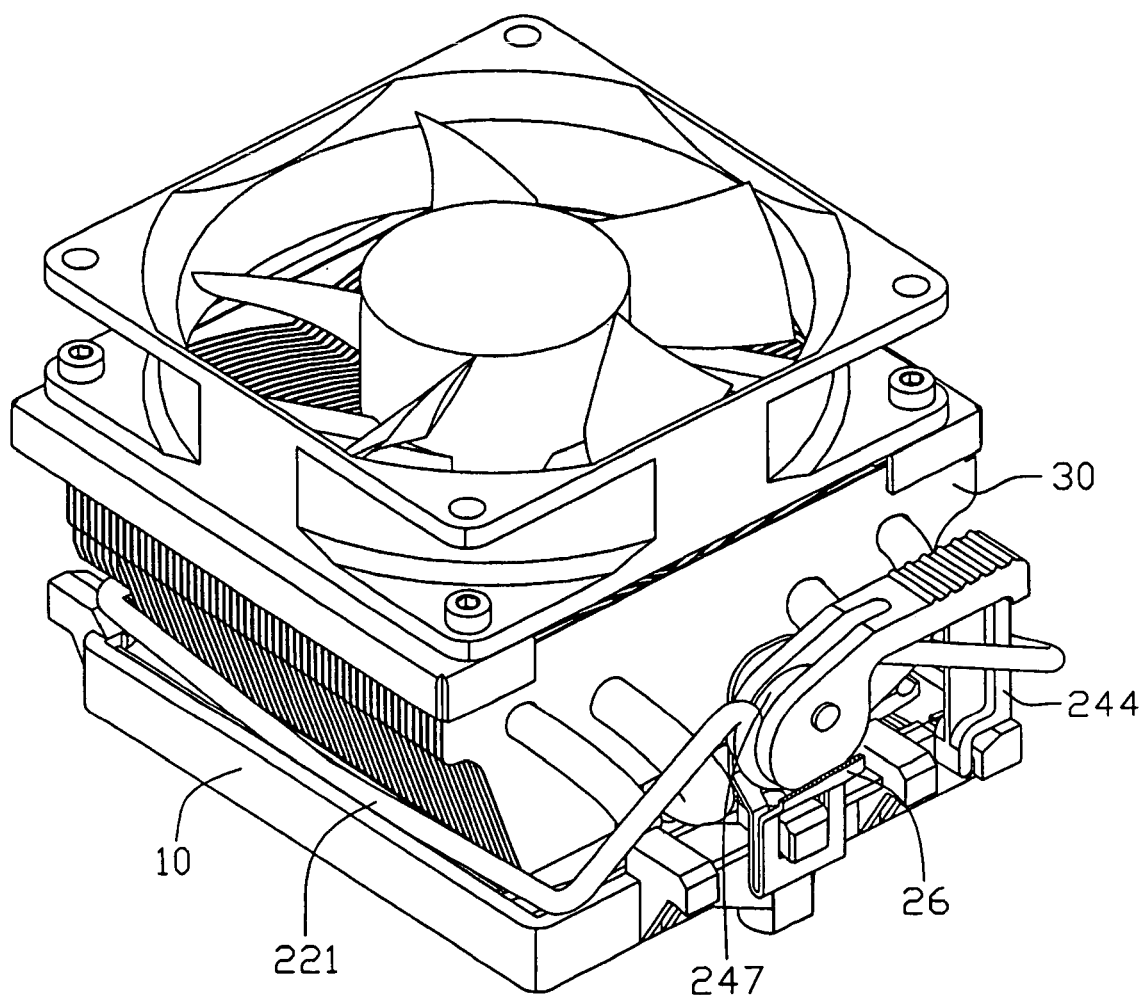
FIG. 4 is an assembled view of FIG. 1 with a portion of the locking device being cut away.
Figure 5:
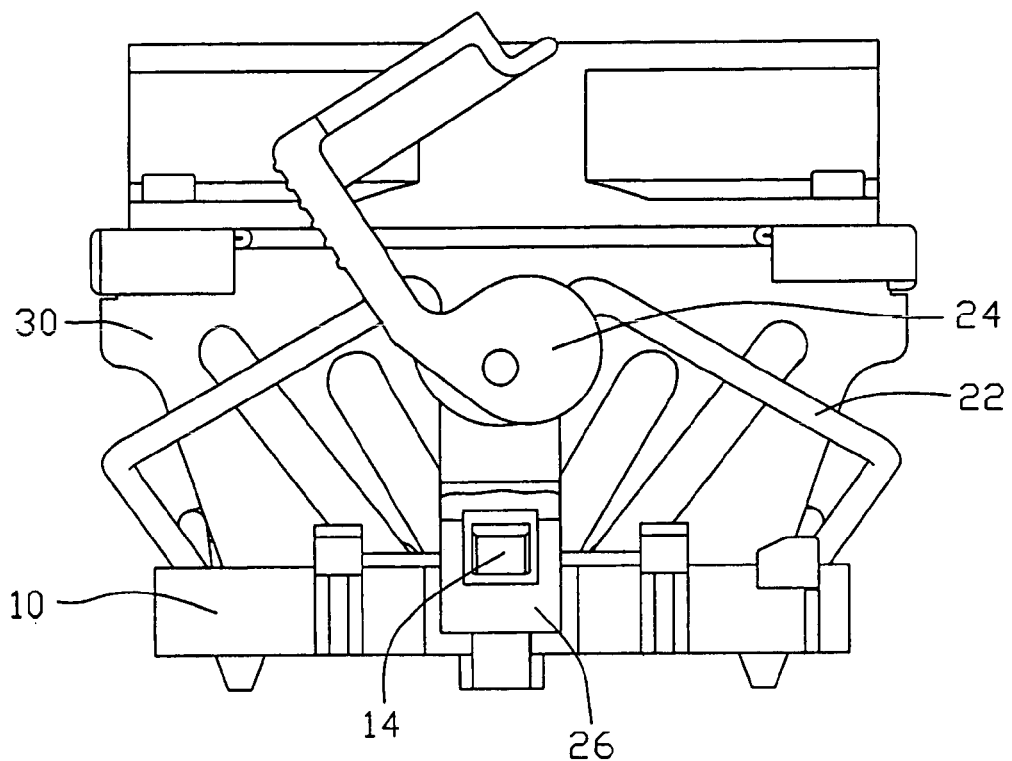
FIG. 5 is a side elevation view of FIG. 4, but showing the camming member located at a unlocked position.
Figure 6:
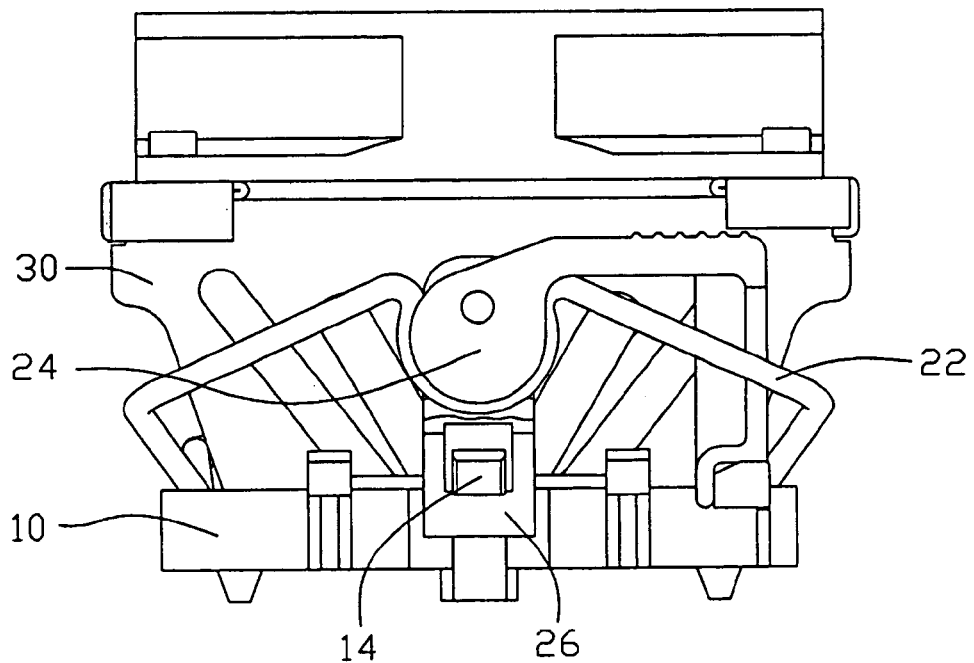
FIG. 6 is a side elevation view of FIG. 4 with the camming member located at a locked position.
Figure 7:
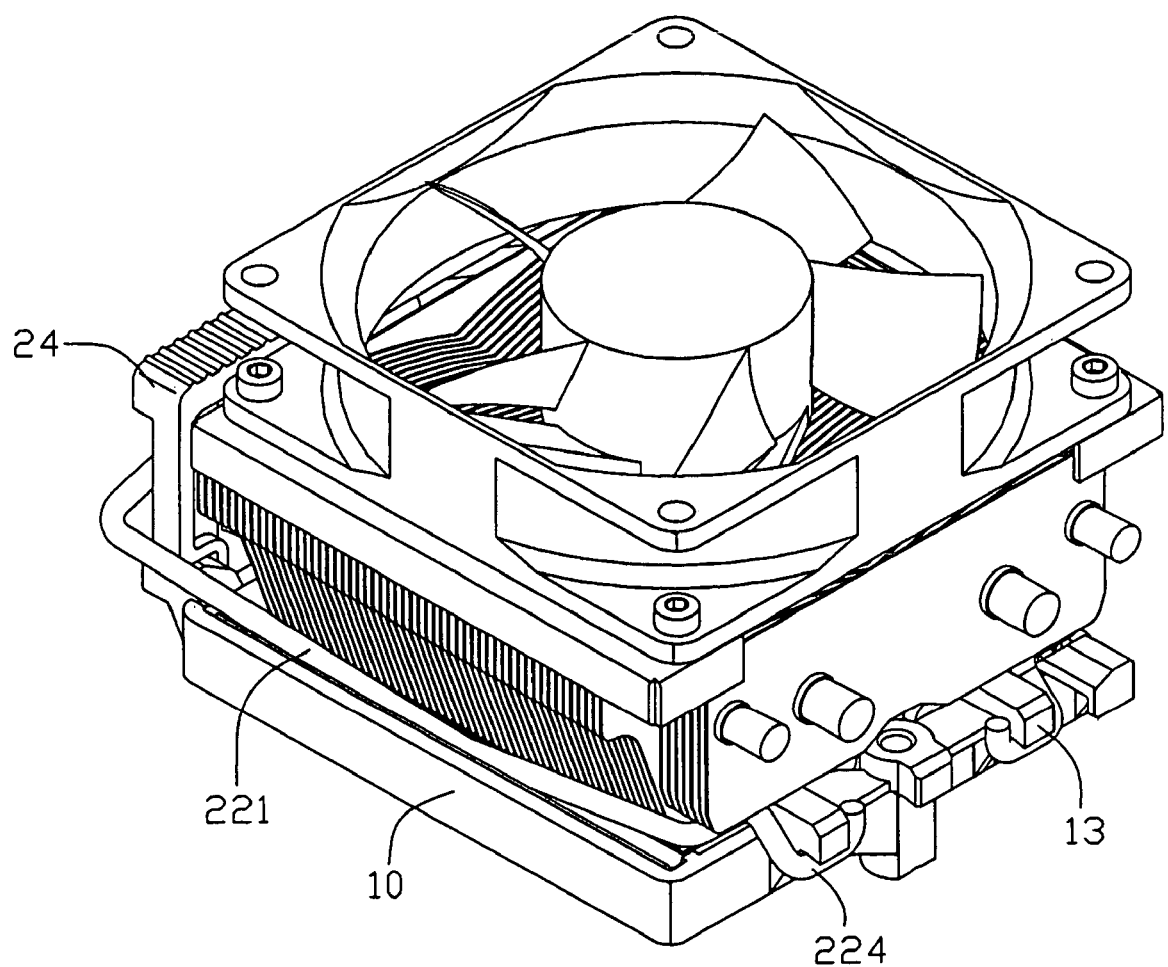
FIG. 7 is similar to FIG. 4, but viewed from another aspect.
Figure 8:
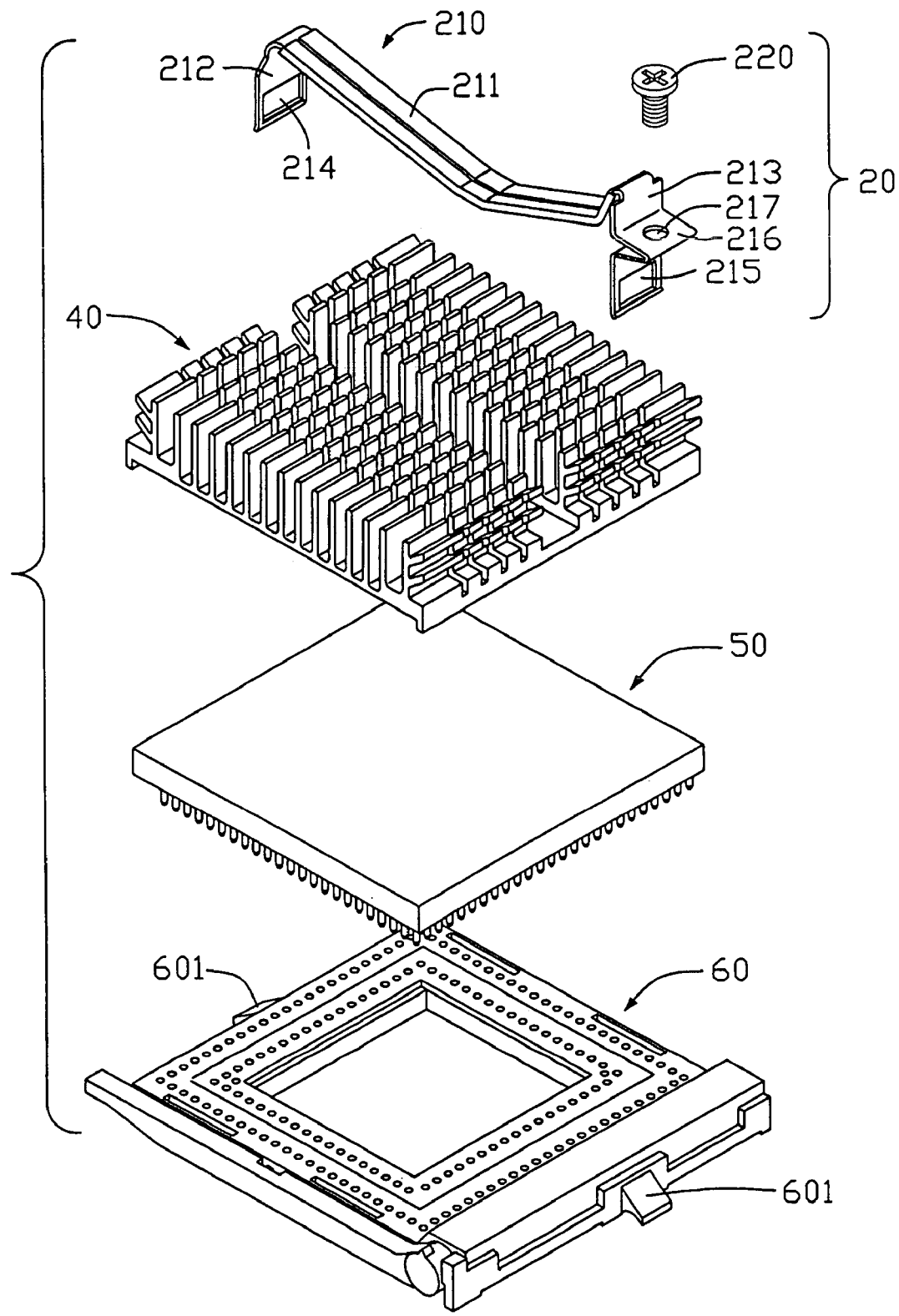
FIG. 8 is an isometric view of a conventional heat sink retainer, together with a heat sink, a CPU and a socket.
Figure 9:
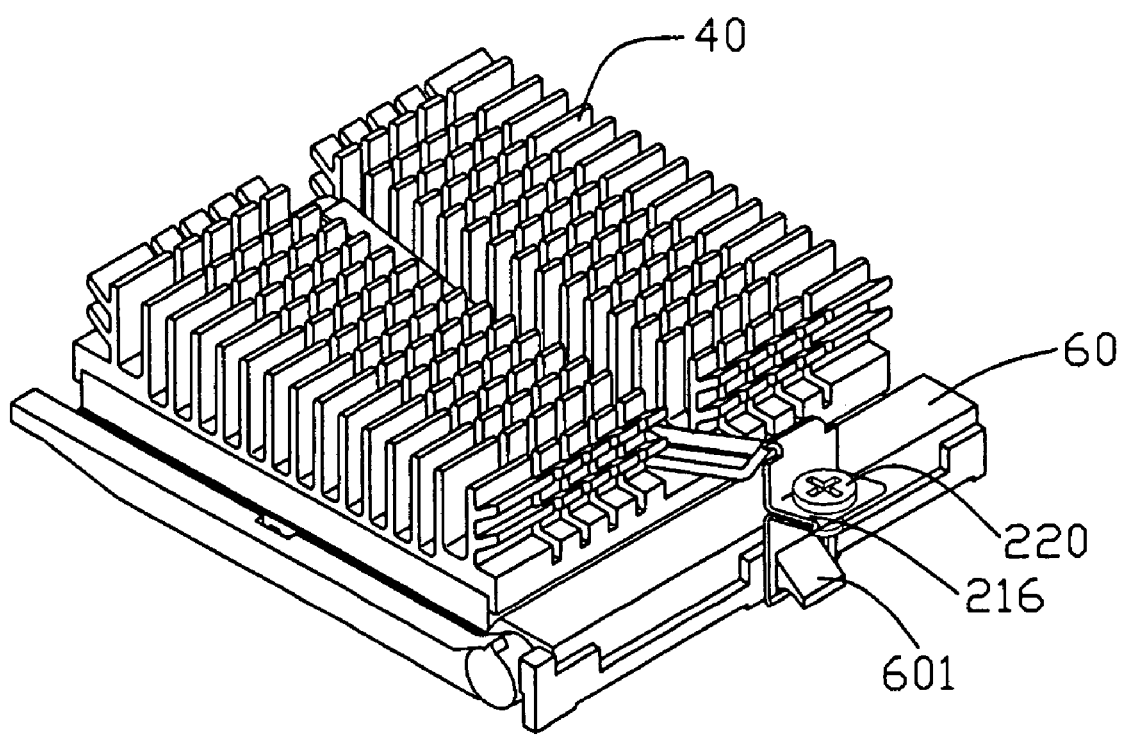
FIG. 9 is an assembled view of FIG. 8.

Another embodiment of the clip of the retaining device is shown in FIG. 3. The clip 23 includes a pair of spaced apart pressing beams 231, a latching beam 233 being engageable with the first catches 13 of the retention module 10 and a crossbeam 235. The latching beam 233 and the crossbeam 235 integrally extend between the pressing beams 221 at opposite sides thereof.

Referring also to FIGS. 4–7, in operation, the heat sink 30 is placed in the retention module 10 with the base 32 seated on the CPU 40. The pressing beams 221 of the clip 22 span across a top of the heat sink 30 with the pressing portions 222 thereof received in respective grooves 34 of the base 32. The latching beams 223 of the clip 22 and the locking device 26 are loosely attached to the retention module 10 via the locking portions 224 and the retaining hole 264 engaging with the corresponding first and second catches 13, 14. At this state, the camming member 24 is located at an unlocked position (see FIG. 5). The releasing portion 247 of the groove 245 is maintained in contact with the crossbeam 225 and the hooked potion 244 of the camming member 24 is located away from the third catch 15 of the retention module 10. Then, the handle 241 is operated to cause the camming member 24 to rotate about the pivot 28 in a first plane parallel to the fins 33 of the heat sink 30 until the hooked portion 244 is retained at the third catch 15 of the retention module 10. At this state, the abutting portion 246 of the groove 245 is maintained in close contact with the crossbeam 225 and the camming member is located at a locked position (see FIG. 6). When the camming member 24 rotates from the unlocked position to the locked position, the cam 242 presses the crossbeam 225 downward to accordingly cause the locking device 26 to move up and each pressing beam 221 to resiliently deflect in a second plane being perpendicular to said first plane. Thus, the locking portions 224 of the latching beams 223 and the retaining hole 264 of the locking device 26 are firmly retained at respective first and second catches 13, 14 of the retention module 10 and the pressing portions 222 of the pressing beams 221 exert a downward force on the base 32 to thereby keep the heat sink 30 into intimate contact with the CPU 40.

In disassembly, the hooked portion 244 of the camming member 24 is disengaged from the third catch 15 of the retention module 10 and is pulled away from the third catch 15 to the unlocked position. The crossbeam 225 and the pressing beams 221 restore to their original states. Accordingly, the locking portions 224 and the locking device 24 are released to loosely engage with the retention module 10. After that, the retaining device 20 can be easily removed away from the heat sink 30.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink retainer comprising:
 a wire clip including a pair of pressing beams being spaced to each other, at least one latching beam provided at one side of said pressing beams and a crossbeam extending between said pressing beams at an opposite side thereof;
 a locking device; and
 a camming member pivotably attached to the locking device and including a cam being engageable with said crossbeam;
 wherein the camming member is pivotable relative to said locking device from an unlocked position to a locked position to press the crossbeam to move downward relative to the locking device.

2. The heat sink retainer of claim 1, wherein the clip is made from an unitary metal wire.

3. The heat sink retainer of claim 2, wherein each pressing beam is bent to provide a V-shaped pressing portion.

4. The heat sink retainer of claim 2, wherein the crossbeam has a semicircular engagement portion formed at a middle section thereof, and the cam circumferentially defines a groove around a periphery thereof for engagingly receiving said engagement portion.

5. The heat sink retainer of claim 4, wherein the groove has an abutting portion maintained in contact with said engagement portion when the camming member is located at the locked position and a releasing portion maintained in contact with said engagement portion when the camming member is located at the unlocked position.

6. The heat sink retainer of claim 5, wherein the cam defines a pivot hole for extension of a pivot therethough, and the distance between the pivot and the abutting portion of the groove is greater than the distance between the pivot and the releasing portion.

7. The heat sink retainer of claim 4, wherein the crossbeam includes two inclined extension arms each extending between one pressing beam and said engagement portion.

8. The heat sink retainer of claim 2, wherein the camming member further includes an operation handle equipped with anti-skid ribs for facilitating operations.

9. An assembly comprising:
an electronic device surrounded by a retention module;
a heat sink positioned on said electronic device; and
a heat sink retainer for retaining said heat sink to said electronic device, the heat sink retainer comprising:
a clip including a pair of spaced pressing beams for biasing said heat sink toward said electronic device at opposite sides of the heat sink at least one latching beam being provided at one side of the pressing beams and engaging with the retention module at one side thereof, a crossbeam extending between the pressing beams at an opposite side thereof;
a locking device for engaging with the retention module at an opposite side thereof; and
a camming member pivotably attached to the locking device and including a cam being engageable with said crossbeam, the camming member being capable of moving relative to said locking device in a first plane between an unlocked position and a locked position; wherein
when the camming member moves from said unlocked position to said locked position, the locking member is driven to move in the first plane to engage with the retention module and the pressing beams of the clip resiliently deflect in a second perpendicular to the first plane to press the heat sink toward the electronic device.

10. The assembly of claim 9, wherein the clip is made from an unitary metal wire.

11. The assembly of claim 9, wherein the crossbeam includes a semicircular engagement portion and the cam circumferentially defines a groove around a periphery thereof for engagingly receiving said engagement portion.

12. The assembly of claim 9, wherein the camming member further includes an operation handle equipped with anti-skid ribs for facilitating operation.

13. The assembly of claim 12, wherein the camming member further includes a hooked portion extending from said operation handle and engaged with the retention module when the camming member is located at the locked position.

14. The assembly of claim 9, wherein each pressing beam provides a V-shaped pressing portion for abutting said heat sink.

15. The assembly of claim 14, wherein the heat sink includes a base and a plurality cooling fins extending from the base.

16. The assembly of claim 15, wherein the base defines a pair of grooves at opposite sides thereof for receiving said V-shaped pressing portion.

17. The assembly of claim 9, wherein the clip and the camming member commonly surround the heat sink.

18. A retainer for retaining a heat sink to an electronic device, comprising:
a wire clip having at least one pressing beam extending along said heat sink and placed thereon, a latching beam formed at one end of said at least one pressing beam and securely engagable beside said electronic device for retaining said heat sink to said electronic device, and a crossbeam formed at the other end of said at least one pressing beam;
a locking device disposed next to said crossbeam and securely engagable beside said electronic device for said retaining; and
an urging member attached to said locking device and used to urge said crossbeam of said wire clip linearly moving toward said electronic device relative to said locking device so as to result in resilient deformation of said at least one pressing beam against said heat sink for being forcedly retained to said electronic device.

19. The retainer of claim 18, wherein said locking device has two spaced tabs to form a space therebetween, and said urging member and said crossbeam are partially received in said space.

20. The retainer of claim 18, wherein said urging member is pivitably attached to said locking member and has a cam disposed against said crossbeam.

* * * * *